(12) United States Patent
Yokoo

(10) Patent No.: US 8,134,602 B2
(45) Date of Patent: Mar. 13, 2012

(54) AMPLIFIER CIRCUIT

(75) Inventor: Satoshi Yokoo, Ota (JP)

(73) Assignees: Sanyo Electric Co., Ltd., Osaka (JP); Sanyo Semiconductor Co., Ltd., Gunma (JP)

( * ) Notice: Subject to any disclaimer, the term of this patent is extended or adjusted under 35 U.S.C. 154(b) by 499 days.

(21) Appl. No.: 12/341,741

(22) Filed: Dec. 22, 2008

(65) Prior Publication Data

US 2009/0160961 A1 Jun. 25, 2009

(30) Foreign Application Priority Data

Dec. 25, 2007 (JP) ................................. 2007-332997

(51) Int. Cl.
*H04N 5/228* (2006.01)
(52) U.S. Cl. .................................................. 348/208.11
(58) Field of Classification Search .............. 348/208.11
See application file for complete search history.

(56) References Cited

U.S. PATENT DOCUMENTS

| | | | | |
|---|---|---|---|---|
| 5,300,896 | A * | 4/1994 | Suesserman | 330/260 |
| 6,091,448 | A * | 7/2000 | Washisu et al. | 348/208.16 |
| 6,566,946 | B2 * | 5/2003 | Llewellyn | 330/69 |
| 6,694,096 | B1 * | 2/2004 | Imada | 396/52 |
| 7,671,674 | B2 * | 3/2010 | Freeke | 330/69 |
| 2003/0006837 | A1 * | 1/2003 | Score et al. | 330/10 |
| 2005/0231277 | A1 * | 10/2005 | Ogawa | 330/98 |
| 2007/0252645 | A1 * | 11/2007 | Tsurumi | 330/124 R |
| 2009/0002825 | A1 * | 1/2009 | Morita et al. | 359/554 |
| 2009/0128229 | A1 * | 5/2009 | Watanabe et al. | 327/539 |

FOREIGN PATENT DOCUMENTS

| | | |
|---|---|---|
| JP | 7-23277 | 1/1995 |
| JP | 10-213832 | 8/1998 |
| JP | 11-187308 | 7/1999 |
| JP | 2005-286973 | 10/2005 |
| JP | 2006094158 A | 4/2006 |

OTHER PUBLICATIONS

Nairn, D. G. 1999. Operational Amplifiers. Wiley Encyclopedia of Electrical and Electronics Engineering.*
Tong Ge; Chang, J.S.; Wei Shu; , "PSRR of bridge-tied load PWM Class D Amps," Circuits and Systems, 2008. ISCAS 2008. IEEE International Symposium on , vol., no., pp. 284-287, May 18-21, 2008 doi: 10.1109/ISCAS.2008.4541410 URL: http://ieeexplore.ieee.org/stamp/stamp.jsp?tp=&arnumber=4541410 &isnumber=4541329.*
esp@cenet Patent Abstract for Japanese Publication No. 2006094158, publication date Apr. 6, 2006. (1 page).
Korean Office Action for Application No. 10-2008-132836, mailed on Jun. 28, 2010 (4 pages).

(Continued)

*Primary Examiner* — Sinh Tran
*Assistant Examiner* — Jason Flohre
(74) *Attorney, Agent, or Firm* — Osha • Liang LLP

(57) ABSTRACT

In a first operational amplifier, an input signal is input to the negative input terminal, a reference voltage is input to the positive input terminal, a feedback path from the output terminal to the negative input terminal is formed, and the input signal is amplified by a predetermined amplification factor. In a second operational amplifier, an output from the first operational amplifier is input to the positive input terminal, the reference voltage is input to the negative input terminal, and a pair of outputs having opposite polarities to each other and used for performing BTL drive of a load are obtained at the output terminal. Using the above arrangement, a low-frequency signal can be amplified.

5 Claims, 1 Drawing Sheet

OTHER PUBLICATIONS esp@cenet patent abstract for Japanese Publication No. 10213832, Publication date Aug. 11, 1998 (1 page).

esp@cenet patent abstract for Japanese Publication No. 7023277, Publication date Jan. 24, 1995 (1 page).

esp@cenet patent abstract for Japanese Publication No. 11-187308, Publication date Jul. 9, 1999 (1 page).

esp@cenet patent abstract for Japanese Publication No. 2005286973, Publication date Oct. 13, 2005 (1 page).

* cited by examiner

US 8,134,602 B2

AMPLIFIER CIRCUIT

PRIORITY INFORMATION

This application claims priority to Japanese Patent Application No. 2007-332997, filed on Dec. 25, 2007, which is incorporated herein by reference in its entirety.

BACKGROUND

1. Technical Field

The present invention relates to an amplifier circuit for obtaining a BTL (Bridged, Transformerless) output.

2. Related Art

Conventionally, BTL drive is known as a method for driving a load over a sufficient dynamic range under limited power supply voltages, and is widely employed for driving speakers and the like.

In image capturing apparatuses such as video cameras and digital still cameras, blurring tends to occur in object images due to camera shake caused by hand movement and other vibrations. In response to the demand for preventing generation of such undesirable captured images, image capturing apparatuses are provided with anti-vibration functions. In a known anti-vibration function (as described for example in JP 7-023277 A, JP 10-213832 A, and JP 11-187308 A), vibrations of an image capturing apparatus relative to the object are detected, and in accordance with the detected vibrations, the optical system (the lens or the image capturing element) is subjected to shift correction using a motor.

As the motor for carrying out the optical correction, a voice coil motor or the like is used. In order to achieve efficient drive of the voice coil motor, BTL drive is employed. For example, a BTL amplifier as shown in FIG. 2 is used. Specifically, an input signal used for the correction is input to the positive non-inverting input terminal of an operational amplifier OP0 via a capacitor Ci for eliminating direct current components. Meanwhile, a reference voltage Vref is input to the negative inverting input terminal of the operational amplifier OP0 via a buffer amplifier BA. By connecting the output of the buffer amplifier BA to the positive input terminal of the operational amplifier OP0 via a resistor Ri, the direct current level of the signal input to the positive input terminal of the operational amplifier OP0 is set to the reference voltage Vref. Using this arrangement, it is possible to obtain, as the output of the operational amplifier OP0, a pair of BTL outputs having opposite polarities from each other, with respect to the reference voltage Vref serving as the center.

When performing correction for camera shake due to hand movement, there are cases in which the frequency of the input signal is within a low bandwidth ranging from the DC level to several tens of Hz, for example, and it is desired that such an input signal also be subjected to amplification. Further, when the amplifier gain is to be changed, it is conventionally necessary to change the amplification factor for each of the pair of amplifier outputs, with the result that a large number of components are required, and gain adjustment must be performed for each of the pair of outputs.

SUMMARY

According to one aspect, the present invention provides an amplifier circuit including a first operational amplifier in which an input signal is input to a negative input terminal, a reference voltage is input to a positive input terminal, a feedback path from an output terminal to the negative input terminal is formed, and the input signal is amplified by a predetermined amplification factor; and a second operational amplifier in which an output from the first operational amplifier is input to a positive input terminal, the reference voltage is input to a negative input terminal, and a pair of outputs having opposite polarities from each other are obtained at an output terminal; wherein a pair of outputs having opposite polarities from each other and used for performing BTL drive of a load are obtained as outputs of the second operational amplifier.

According to the present invention, it is possible to amplify an input signal into signals centered about a predetermined reference voltage, without using a direct current eliminating capacitor. Accordingly, a low-frequency signal can also be amplified.

DETAILED DESCRIPTION

An embodiment of the present invention will be next described with reference to the drawings.

Figure 1:
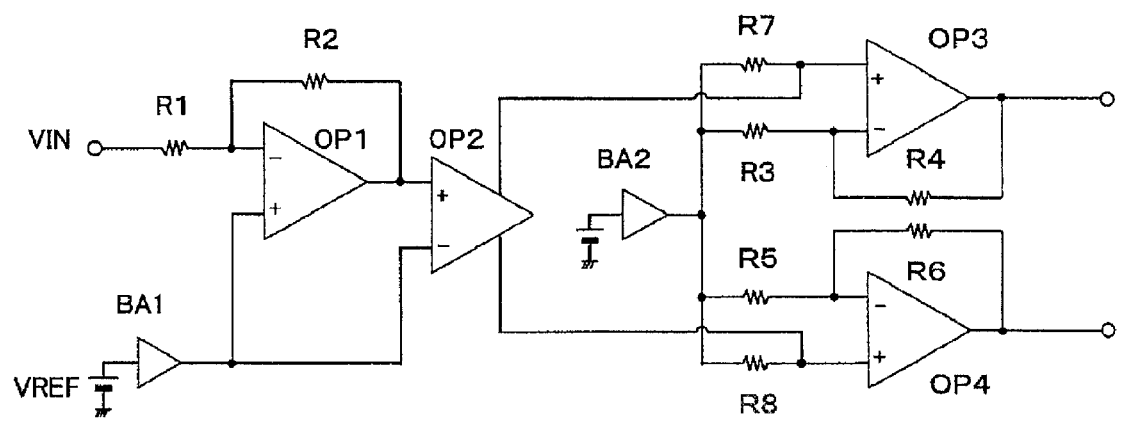
FIG. 1 is a diagram showing a configuration of an amplifier circuit according to an embodiment of the present invention.
Figure 2:
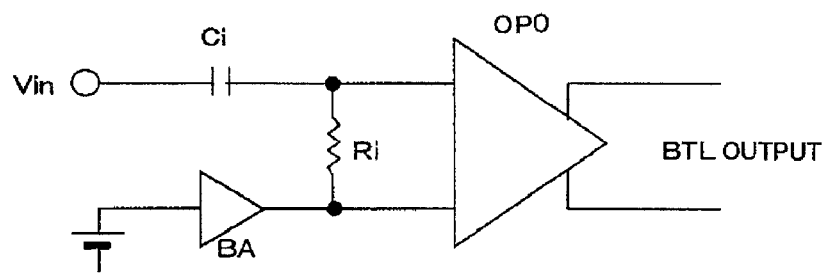
FIG. 2 is a diagram showing a configuration of a conventional amplifier circuit.

FIG. 1 is a diagram showing a configuration of an amplifier circuit according to an embodiment of the present invention. An input signal Vin is input to the negative input terminal of an operational amplifier OP1 via a resistor R1. The output terminal and negative input terminal of the operational amplifier OP1 are connected via a feedback resistor R2. Further, the output terminal of the operational amplifier OP1 is connected to the positive input terminal of an operational amplifier OP2.

Meanwhile, a reference voltage Vref is input via a buffer amplifier BA1 to the positive input terminal of the operational amplifier OP1 and the negative input terminal of the operational amplifier OP2.

Accordingly, the input signal Vin subjected to inverting amplification at the gain determined by the resistance ratio R2/R1 is input to the positive input terminal of the operational amplifier OP2. The operational amplifier OP2 outputs this input signal, as a pair of signals having opposite polarities relative to the reference voltage Vref input, to the negative input terminal. The operational amplifier OP2 includes a differential amplifier element, and the outputs are extracted from both the inverted side and the non-inverted side.

One of the outputs from the operational amplifier OP2 (in this example, the positive output) is input to the positive input terminal of an operational amplifier OP3. Further, the other of the outputs from the operational amplifier OP2 (in this example, the negative output) is input to the positive input terminal of an operational amplifier OP4.

The negative input terminal of the operational amplifier OP3 receives input, via a resistor R3, of a reference voltage obtained by stabilizing (½)Vcc using a buffer amplifier BA2. In this operational amplifier OP3, the negative input terminal is connected with the output terminal via a feedback resistor R4. The negative input terminal of the operational amplifier OP4 receives input, via a resistor R5, of the reference voltage obtained by stabilizing (½)Vcc using the buffer amplifier BA2. In this operational amplifier OP4, the negative input terminal is connected to the output terminal via a feedback resistor R6. Further, the positive input terminal of the operational amplifier OP3 is supplied with the output (½)Vcc from the buffer amplifier BA2 via a resistor R7, and the positive input terminal of the operational amplifier OP4 is supplied with the output (½)Vcc from the buffer amplifier BA2 via a resistor R8. The DC components at the positive input terminals of these operational amplifiers OP3 and OP4 are set to (½)Vcc.

By configuring such that the resistance ratios are (R4/R3)=(R6/R5)=1 in the above arrangement, a pair of signals (BTL output signals) obtained by amplifying the input signals to have opposite polarities to each other with respect to (½)Vcc serving as the center are obtained at the output terminals of the operational amplifiers OP3 and OP4. Accordingly, by connecting this pair of output terminals to a voice coil, a predetermined drive current flows in the voice coil, making it possible, for example, to drive a lens to achieve the function of correcting for camera shake due to hand movement. The voice coil motor includes a plurality of voice coils so as to be capable of adjusting positions in two dimensions or three dimensions. A plurality of the amplifier circuits of the present embodiment are similarly provided, in a number corresponding to the plurality of voice coils.

According to the present embodiment, the operational amplifier OP1 amplifies or attenuates the input signal Vin to a predetermined voltage relative to the reference voltage Vref, and inputs the obtained result to the operational amplifier OP2. This input path therefore includes no high-pass filter such as a direct current eliminating capacitor. As such, even when the input signal has a frequency within a low bandwidth ranging from the DC level to several tens of Hz, an output in accordance with the input signal can be obtained. Further, by using OP3 and OP4, the output from the operational amplifier OP2 can be subjected to a reliable level shift relative to (½)Vcc. Moreover, it is possible to adjust the amplitude of the signal input into the operational amplifier OP2 by changing, for example, the resistance ratio R2/R1 in OP1, such that the gain for the two outputs from the overall amplifier circuit can be easily controlled.

The invention claimed is:

1. An amplifier circuit comprising:
   a first operational amplifier in which an input signal is input to a negative input terminal, a reference voltage is input to a positive input terminal, a feedback path from an output terminal to the negative input terminal is formed, and the input signal is amplified by a predetermined amplification factor; and
   a second operational amplifier in which an output from the first operational amplifier is input to a positive input terminal, the reference voltage is input to a negative input terminal, and a pair of outputs having opposite polarities to each other are obtained at an output terminal; wherein
   a pair of outputs having opposite polarities to each other and configured to perform BTL drive of a load are obtained as outputs of the second operational amplifier,
   wherein a resistor is provided in an input line for inputting the input signal to the first operational amplifier, a feedback resistor is provided in the feedback path, and a resistance ratio of these resistors determines the amplification factor of the first operational amplifier, and
   wherein the input signal is a signal configured to correct for camera shake due to hand movement, and the load is a voice coil motor for carrying out an optical correction.

2. The amplifier circuit according to claim 1, wherein the input signal is a signal configured to correct for camera shake due to hand movement, and the load is a voice coil motor for carrying out an optical correction.

3. The amplifier circuit according to claim 1, wherein the voice coil motor carries out shift correction of a lens or an image capturing element.

4. The amplifier circuit according to claim 2, wherein the voice coil motor carries out shift correction of a lens or an image capturing element.

5. The amplifier circuit according to claim 1 further comprising:
   a third operational amplifier and a fourth operational amplifier,
   wherein the third operational amplifier and the fourth operational amplifier each receive one of the pair of outputs having opposite polarities from the second operational amplifier, amplify the received pair of outputs with VCC/2, and output the amplified pair of outputs.

* * * * *